(12) United States Patent
Lund

(10) Patent No.: US 9,496,299 B1
(45) Date of Patent: Nov. 15, 2016

(54) LAYOUT FOR ROUTING COMMON SIGNALS TO INTEGRATING IMAGING PIXELS

(71) Applicant: Sensors Unlimited, Inc., Princeton, NJ (US)

(72) Inventor: Joshua Lund, Dallas, TX (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 14/702,164

(22) Filed: May 1, 2015

(51) Int. Cl.
  *H01L 27/146* (2006.01)

(52) U.S. Cl.
  CPC ... *H01L 27/14609* (2013.01); *H01L 27/14636* (2013.01)

(58) Field of Classification Search
  CPC .......... H01L 27/14609; H01L 27/14636; H01L 27/14643; H01L 27/1464; H01L 29/7869; H01L 27/0207
  See application file for complete search history.

(56) References Cited

U.S. PATENT DOCUMENTS

| | | | | |
|---|---|---|---|---|
| 5,258,618 A * | 11/1993 | Noble | ................. | G01J 5/08 250/332 |
| 5,610,629 A * | 3/1997 | Baur | ................. | G06F 3/0412 345/104 |
| 6,266,037 B1 | 7/2001 | Flasck | | |
| 7,088,052 B2 * | 8/2006 | Kimura | ................. | G09G 3/3233 315/169.2 |
| 8,724,040 B2 | 5/2014 | Sumi | | |
| 2002/0008767 A1 | 1/2002 | Lee | | |
| 2002/0047822 A1 * | 4/2002 | Senda | ................. | G09G 3/32 345/90 |
| 2005/0122441 A1 * | 6/2005 | Shimoshikiryoh | . | G02F 1/13624 349/38 |
| 2008/0079685 A1 * | 4/2008 | Umezaki | ................. | G09G 3/3677 345/100 |
| 2008/0297676 A1 * | 12/2008 | Kimura | ................. | G02F 1/13624 349/39 |
| 2009/0002586 A1 * | 1/2009 | Kimura | ................. | G02F 1/136213 349/39 |
| 2009/0224351 A1 * | 9/2009 | Hsieh | ................. | H01L 27/14609 257/444 |
| 2009/0225237 A1 * | 9/2009 | Sugimoto | ................. | G02B 26/0841 348/755 |
| 2009/0303363 A1 * | 12/2009 | Blessinger | ................. | H04N 5/355 348/300 |
| 2010/0053726 A1 * | 3/2010 | Shirai | ................. | G02B 26/0841 359/291 |

(Continued)

OTHER PUBLICATIONS

Yoon, N.; Kim B.; Lee H. and Kim C.; "Design and implementation of infrared readout circuit using a new input circuit of current mirroring direct injection (CMDI)"; Department of Electrical Engineering and Centre for Electro-Optics Korea Advanced Institute of Science and Technology, 305-701 Taejon, Korea; Opto-Electr. Rev., 7, No. 4 1999.

(Continued)

*Primary Examiner* — Yosef Gebreyesus
(74) *Attorney, Agent, or Firm* — Locke Lord LLP; Scott D. Wofsy; Joshua L. Jones

(57) ABSTRACT

An imager is provided that includes an integrated circuit. The integrated circuit includes at least one metal layer, a signal line extending in a first direction, and a pixel cell. The pixel cell includes imaging pixels and a metal interconnect. The imaging pixels include first, second, third, and fourth imaging pixels, arranged in two rows and two columns, each imaging pixel having a metal-insulator-metal (MiM) capacitor disposed on the at least one metal layer, the first and second imaging pixels being traversed by the signal line to receive signals from the signal line. The metal interconnect extends in a second direction different than the first direction and is coupled to the signal line and the third imaging pixel to transmit the signals to the third imaging pixel. The third imaging pixel is adjacent to the first imaging pixel and is disposed in a different column or row than the second imaging pixel.

15 Claims, 3 Drawing Sheets

(56) References Cited

U.S. PATENT DOCUMENTS

2013/0161487 A1* 6/2013 Sakaguchi ........ H01L 27/14601
250/208.1
2014/0198092 A1* 7/2014 Azizi .................... G09G 3/006
345/212

OTHER PUBLICATIONS

York, Timothy; "Fundamentals of Image Sensor Performance"; <http://www1.cse.wustl.edu/>-jain/cse567-11/ftp/imgsens/index.html.

* cited by examiner

LAYOUT FOR ROUTING COMMON SIGNALS TO INTEGRATING IMAGING PIXELS

BACKGROUND OF THE INVENTION

1. Field of the Invention

The present disclosure relates to integrating imaging pixels, and more particularly to a layout for routing common signals to integrating imaging pixels.

2. Description of Related Art

Many conventional layouts for arrays of integrating imaging pixels include multiple signal lines for transmitting common signals to adjacent imaging pixels. The imaging pixels can be arranged on one or more metal layers. The imaging pixels can have integrating capacitors that are metal-insulator-metal (MiM) capacitors that compete with the signal lines for allocation of the metal layers. When the well capacity of a MiM capacitor disposed in an imaging pixel is increased, the dynamic range performance of the imaging pixel is increased. The well capacity of the MiM capacitor depends upon the size of the metal layers allocated to the MiM capacitor. However, the signal lines compete with the MiM capacitors for allocation of the metal layers. As the number of signal lines increases, the area of the metal layers that can be allocated to the MiM capacitors is reduced, and the dynamic range performance of the integrating pixels can be reduced.

Such conventional methods and systems have generally been considered satisfactory for their intended purpose. However, there is still a need in the art for improved layouts of integrating imaging pixel cells. The present disclosure provides a solution for these problems.

SUMMARY OF THE INVENTION

In accordance with an aspect of the disclosure, an imager includes an integrated circuit that includes at least one metal layer, a signal line extending in a first direction, and a pixel cell. The pixel cell includes imaging pixels and a metal interconnect. The imaging pixels include first, second, third, and fourth imaging pixels, arranged in two rows and two columns, each imaging pixel having a metal-insulator-metal (MiM) capacitor disposed on the at least one metal layer, the first and second imaging pixels being traversed by the signal line to receive signals from the signal line. The metal interconnect extends in a second direction different than the first direction and is coupled to the signal line and the third imaging pixel to transmit the signals to the third imaging pixel. The third imaging pixel is adjacent to the first imaging pixel and is disposed in a different column or row than the second imaging pixel.

The imager integrated circuit can include a second metal interconnect that extends in the second direction and is coupled to the signal line and the fourth imaging pixel to transmit the signals to the fourth imaging pixel. The fourth imaging pixel can be adjacent to the second imaging pixel and disposed in a different column or row than the first imaging pixel.

The imager integrated circuit can further include a second pixel cell having imaging pixels. Each imaging pixel of the second pixel cell can receive the signals from the signal line. Additionally, each imaging pixel can have a MiM capacitor disposed on the at least one metal layer.

The second pixel cell can further include a second metal interconnect extending between and coupled to the signal line and one of the imaging pixels of the second pixel cell to transmit the signals.

Each of the imaging pixels of the pixel cell can include electrical devices organized in a pattern. The pattern of adjacent imaging pixels can be organized in substantially mirrored patterns relative to one another. The substantially mirrored pattern can be substantially symmetrical over at least one line of symmetry parallel to at least one of the first and second signal lines.

The imager integrated circuit can further include a second signal line and a second metal interconnect. The second signal line can extend in the second direction and traverse the first and third imaging pixels. The second signal line can extend in the second direction and traverse the first and third imaging pixels. The second metal interconnect can extend in the first direction and can be coupled to the second signal line and the fourth imaging pixel to transmit second signals to the fourth imaging pixel. The length of the metal interconnect can be shorter than the length and width of the imaging pixel it is coupled to.

The imager integrated circuit can further include a second signal line that traverses two imaging pixels of the pixel cell to transmit second signals to the two imaging pixels.

The imaging pixels can be arranged in a 2×2 array of a short wave infrared focal plane array.

In accordance with an aspect of the disclosure, a pixel cell includes imaging pixels, including first, second, third, and fourth imaging pixels, arranged in two rows and two columns. Each imaging pixel has a MiM capacitor disposed on at least one metal layer. The first and second imaging pixels are traversed by a signal line extending in a first direction to transmit signals to both of the first and second imaging pixels. The third imaging pixel is coupled to a metal interconnect that extends in a second direction different than the first direction from the signal line to receive the signals from the signal line. The third imaging pixel is adjacent to the first imaging pixel and is disposed in a different column or row than the second imaging pixel.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
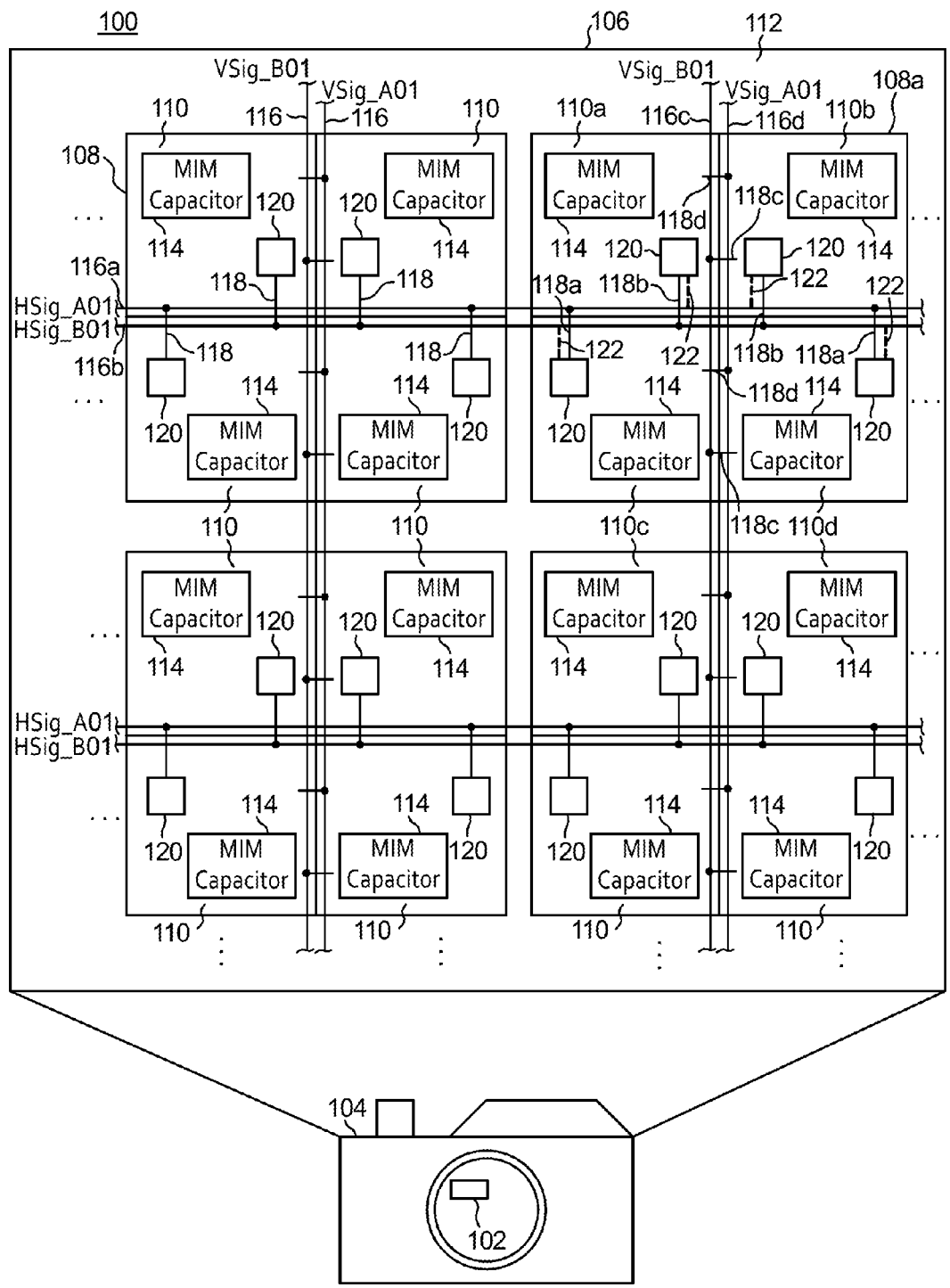
FIG. 1 is a schematic diagram of a pixel cell array of an imaging device in accordance with the disclosure

Reference will now be made to the drawings wherein like reference numerals identify similar structural features or aspects of the subject disclosure. For purposes of explanation and illustration, and not limitation, a schematic diagram of an exemplary embodiment of a portion of a pixel cell array of an imaging device in accordance with the disclosure is shown in FIG. 1 and is designated generally by reference character 100. Other embodiments of the pixel cell array in accordance with the disclosure, or aspects thereof, are provided in FIG. 2, as will be described. The systems and methods described herein can be used to provide an improved pixel cell array, for example in aerospace applications.

FIG. 1 shows a schematic view of an example pixel cell array 100 of a focal plane array (FPA) 102 of an imaging device 104. The pixel cell array 100 can be disposed on an integrated circuit 106. The pixel cell array 100 includes a plurality of pixel cells 108 (including 108a), and each pixel cell 108 includes an array of integrating imaging pixels 110 (including 110a-110d). The pixel cells 108 can be disposed on at least one metal layer 112 of the integrated circuit 106. Each integrating pixel 110 includes an integration capacitor which is configured as a metal-insulator-metal (MiM) capacitor 114 and is disposed on a metal layer 112. At least one signal line 116 (including 116a-116d) traverses the metal layers 112 and the imaging pixels 110 of the pixel cell arrays 100 to route, e.g., transmit, signals to the traversed imaging pixels 110, such as by connecting to an electrical component 120 or trace 122 (indicated by a dotted line) of the traversed imaging pixel 110. At least one metal interconnect 118 (including 118a-118d) is provided that electrically couples one of the signal lines 116 to an electrical component 120 of one of the imaging pixels 110 that is not traversed by the signal line 116.

Figure 2:
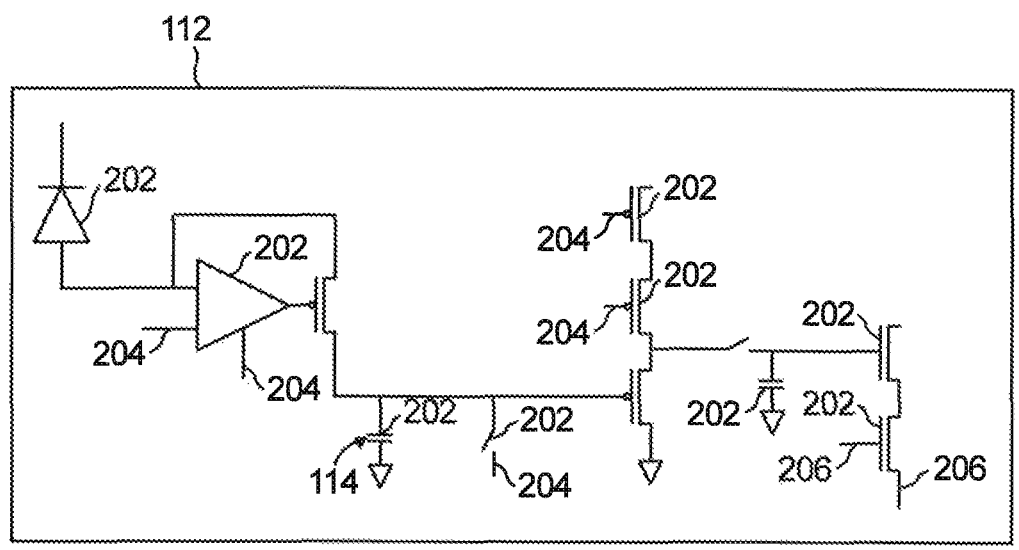
FIG. 2 is a schematic diagram of an imaging pixel included in a pixel cell of the pixel cell array shown in FIG. 1.

FIG. 2 shows a schematic view of an example imaging pixel 110 having MiM capacitor 114 disposed on metal layer 112. The imaging pixel 110 includes one or more electrical components 120, shown in FIG. 2 as individual electrical components 202, such as an operational amplifier, photodiode, transistor, switch, and/or capacitor. Signals, such as control signals or bias signals, are routed to the electrical components 202 of the imaging pixel 110. In some cases, these control signals or bias signals are common signals 204 for multiple rows or columns of imaging pixels 110. In other cases, these control signals or bias signals are unique signals 206 to each row or column of imaging pixels 110.

With reference to an example pixel cell 108a in the upper right quadrant of the pixel cell array 100 shown in FIG. 1, the pixel cell 108a includes imaging pixels 110a-110d, which can be arranged as a 2×2 array. Signal line 116a extends in a horizontal direction and traverses a row including imaging pixels 110a and 110b by electrically coupling to respective electrical components 202 of imaging pixels 110a and 110b.

Metal interconnect 118a electrically couples signal line 116a to an electrical component 202 of imaging pixel 110c, wherein imaging pixel 110c is adjacent to imaging pixel 110a but lies in a different row than imaging pixels 110a,b. Imaging pixel 110c lies in a column with imaging pixel 110a, but does not lie in a column with imaging pixel 110b.

The electrical coupling of a signal line (e.g., signal line 116d) to an electrical component of an imaging pixel 110 can include connecting to an electrical component in the imaging pixel 110 the signal line traverses, or connecting to an electrical component 120 in an adjacent imaging pixel not traversed by the signal line by means of a metal interconnect (e.g., metal interconnect 118a). For example, as signal line 116a traverses imaging pixel 110a, it couples to a trace that is connected to an electrical component (not shown) that is disposed in imaging pixel 110a. Metal interconnect 118a couples between signal line 116a and a trace of imaging pixel 110c that is connected to a counterpart electrical component 120 that is disposed in imaging pixel 110c. In this fashion, the signals delivered by signal line 116a are transmitted by signal line 116a to the electrical component (not shown) disposed in imaging pixel 110a and by the metal interconnect 118a to the counterpart electrical component 120 disposed in imaging pixel 110c. Likewise, signal line 116b traverses imaging pixel 110c and couples to an electrical component (not shown) of imaging pixel 110c Signal line 116b also couples through metal interconnect 118b to a counterpart electrical component 120 disposed in imaging pixel 110a.

A second metal interconnect 118a electrically couples signal line 116a to an electrical component 202 of imaging pixel 110d, wherein imaging pixel 110d is adjacent to imaging pixel 110b but lies in a different row than imaging pixels 110a,b. Imaging pixel 110d lies in a column with imaging pixel 100b, but does not lie in a column with imaging pixel 110a.

Signal line 116a transmits a common signal 204, e.g., a same control signal or bias signal, to electrical components 202 of imaging pixels 110a-d. In a similar fashion, signal line 116a transmits the common signal 204 to other imaging pixels 110 that are disposed in the same row as imaging pixels 110a,b. Additional metal interconnects can be provided to transmit the same common signal to imaging pixels 110 that are disposed in the same row as imaging pixels 110c,d.

Similarly, signal line 116b traverses a row that includes imaging pixels 110c, d to transmit common signals to imaging pixels 110 in that row, and metal interconnects 118b distribute the common signals to imaging pixels disposed in an adjacent row, e.g., the row that includes imaging pixels 110a, b.

Similarly, signal line 116c extends in a vertical direction and traverses a column including imaging pixels 110a and 110c by electrically coupling to respective electrical components 202 of imaging pixels 110a and 110c. Metal interconnect 118c electrically couples signal line 116c to an electrical component 202 of imaging pixel 110b, wherein imaging pixel 110b is adjacent to imaging pixel 110a but lies in a different column than imaging pixels 110a,c. Imaging pixel 110b lies in a row with imaging pixel 100a, but does not lie in a row with imaging pixel 110c.

A second metal interconnect 118c electrically couples signal line 116c to an electrical component 202 of imaging pixel 110d, wherein imaging pixel 110d is adjacent to imaging pixel 110b but lies in a different column than imaging pixels 110a,c. Imaging pixel 110d lies in a row with imaging pixel 100c, but does not lie in a row with imaging pixel 110a.

Signal line 116c transmits a common signal to electrical components 202 of imaging pixels 110a-d. In a similar fashion, signal line 116c transmits the common signal to other imaging pixels 110 that are disposed in the same column as imaging pixels 110a, c. Additional metal interconnects can be provided to transmit the same common signal to imaging pixels 110 that are disposed in the same column as imaging pixels 110b,d.

Similarly, signal line 116d traverses a column that includes imaging pixels 110b, d to transmit common signals to imaging pixels 110 in that column, and metal interconnects 118d distribute the common signals to imaging pixels disposed in an adjacent column, e.g., the column that includes imaging pixels 10a,c.

In order to reduce or minimize the amount of metal used for metal interconnects 118 and the space occupied by the metal interconnects 118, the length of the metal interconnects 118 can be shorter than the length and/or width of the imaging pixel 110 it is coupled to. Additionally, an electrical component included in an imaging pixel 110 can be positioned to be a minimal distance from a signal line that is intended to be coupled to the electrical component by a metal interconnect 118 to reduce or minimize the amount of metal used and the space occupied by the metal interconnect 118.

The electrical components 120 in an imaging pixel 110 can be organized in a pattern, wherein the electrical components 120 of adjacent imaging pixels 110 are organized in mirrored patterns relative to one another. The line of symmetry over which patterns of imaging pixels 110 are mirrored can be parallel to the signal line 116 that traverses or electrically couples to (e.g., using metal interconnects 118).

For example, electrical components 120 included in imaging pixel 110*a* can be arranged so that electrical components that couple with signal lines 116*a* and 116*b* are symmetric with corresponding components in imaging pixel 110*c* over a line of symmetry that is parallel to signal lines 116*a* and 116*b*. Additionally or alternatively, electrical components 120 included in imaging pixel 110*a* can be arranged so that electrical components that couple with signal lines 116*c* and 116*d* are symmetric with corresponding components in imaging pixel 110*b* over a line of symmetry that is parallel to signal lines 116*c* and 116*d*.

A potential advantage of certain embodiments of the pixel cell 108 is that a single signal line 116 can transmit common signals to two adjacent rows or two adjacent columns of imaging pixels 110. The amount of metal and space occupied by the metal interconnects 118 that couple the signal line 116 to imaging pixels 110 in the adjacent column or row can be reduced or minimized. The amount of signal lines 116 used can be reduced or minimized, and the portion of metal layers 112 allocated to transmitting common signals can be reduced or minimized. A larger portion of the metal layers 112 can be allocated to the MiM capacitors 114 of the imaging pixels 110. Thus the well capacity of the imaging pixels 110 can be increased or maximized and dynamic range performance improved.

Figure 3:
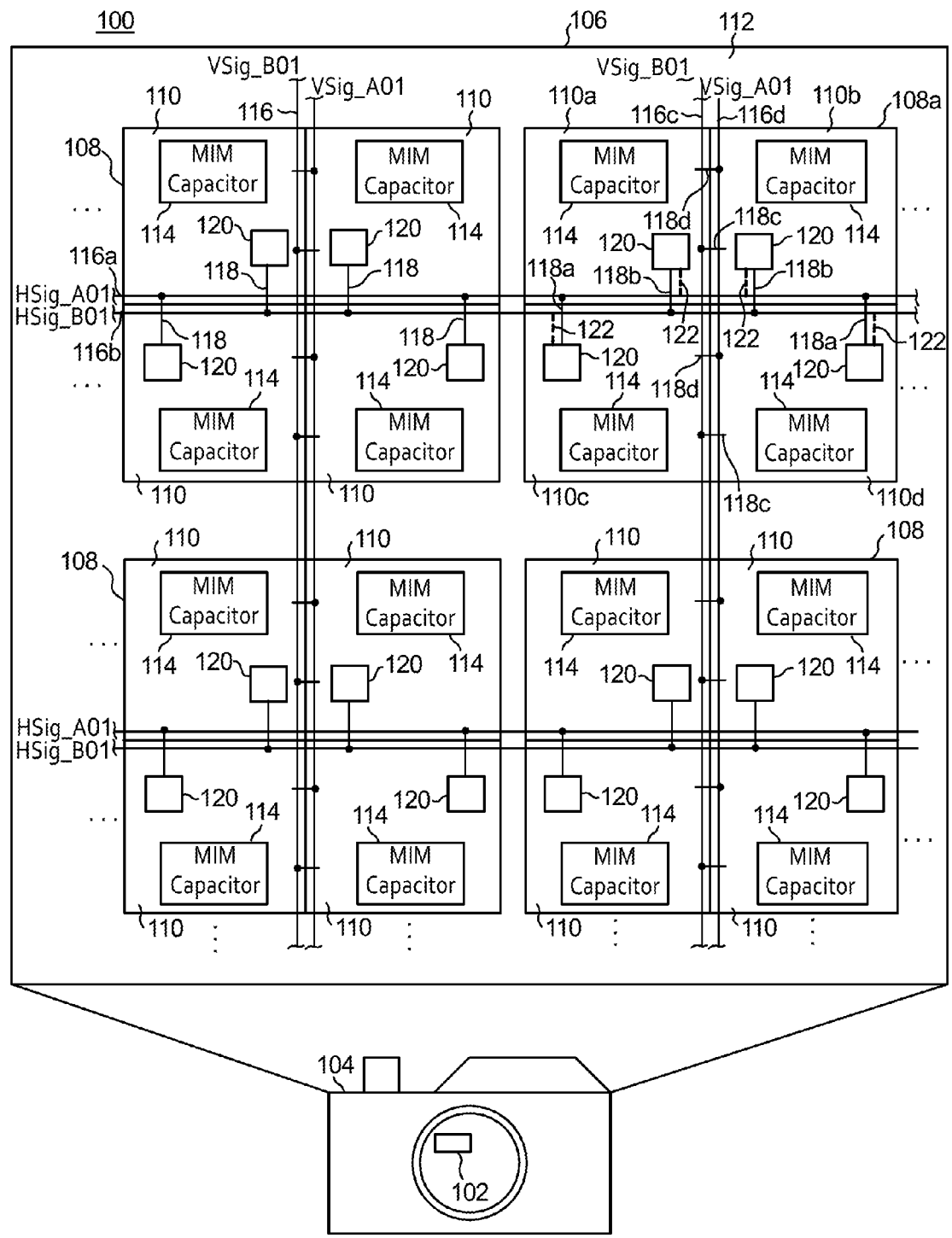
FIG. 3 is a schematic diagram of another embodiment of the pixel cell array shown in FIG. 1.

FIG. 3 shows an embodiment of the pixel cell array 100. The components in the pixel cell array 100 are the same as the components shown in FIG. 1. The difference in the features of the pixel cell array 100 of FIG. 3 relative to FIG. 3 is that the MiM capacitors 114 are shown arranged symmetrical about over two lines of symmetry, namely a line of symmetry that is parallel to signal lines 116*a* and 116*b* and to a line of symmetry that is parallel to signal lines 116*c* and 116*d*.

The methods and systems of the present disclosure, as described above and shown in the drawings, provide for pixel cells and focal plane arrays with superior properties including increased or maximized well capacity of imaging pixels included in the pixel cells and improved dynamic range performance. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. An imager integrated circuit comprising:
   at least one metal layer;
   a signal line extending in a first direction; and
   a pixel cell comprising;
      imaging pixels, including first, second, third, and fourth imaging pixels, arranged in two rows and two columns, each imaging pixel having a metal-insulator-metal (MiM) capacitor disposed on the at least one metal layer, the first and second imaging pixels being traversed by the signal line to receive signals from the signal line, including connecting to at least one of an electrical component and a trace of the respective first and second imaging pixels; and
      a metal interconnect extending in a second direction different than the first direction and being coupled to the signal line and the third imaging pixel to transmit the signals to the third imaging pixel, the third imaging pixel not being traversed by the signal line and being adjacent to the first imaging pixel and disposed in a different column or row than the second imaging pixel.

2. The imager integrated circuit in accordance with claim 1, further comprising a second metal interconnect extending in the second direction and being coupled to the signal line and the fourth imaging pixel to transmit the signals to the fourth imaging pixel, the fourth imaging pixel adjacent to the second imaging pixel, and disposed in a different column or row than the first imaging pixel.

3. The imager integrated circuit in accordance with claim 1, further comprising a second pixel cell having imaging pixels, each imaging pixel of the second pixel cell receiving the signals from the signal line and having a MiM capacitor disposed on the at least one metal layer.

4. The imager integrated circuit in accordance with claim 3, wherein the second pixel cell further includes a second metal interconnect extending between and coupled to the signal line and one of the imaging pixels of the second pixel cell to transmit the signals.

5. The imager integrated circuit in accordance with claim 1, wherein each of the imaging pixels of the pixel cell includes electrical devices organized in a pattern, wherein the pattern of adjacent imaging pixels are organized in substantially mirrored patterns relative to one another.

6. The imager integrated circuit in accordance with claim 5, further comprising;
   a second signal line extending in the second direction and traversing the first and third imaging pixels; and
   a second metal interconnect extending in the first direction and being coupled to the second signal line and the fourth imaging pixel to transmit second signals to the fourth imaging pixel,
   wherein the substantially mirrored pattern is substantially symmetrical over at least one line of symmetry parallel to at least one of the first and second signal lines.

7. The imager integrated circuit in accordance with claim 1, wherein the length of the metal interconnect is shorter than the length and width of the imaging pixel it is coupled to.

8. The imager integrated circuit in accordance with claim 1, further including a second signal line that traverses two imaging pixels of the pixel cell to transmit second signals to the two imaging pixels.

9. The imager integrated circuit in accordance with claim 1, wherein the imaging pixels are arranged in a 2×2 array of a short wave infrared focal plane array.

10. A pixel cell comprising:
    imaging pixels, the imaging pixels comprising first, second, third, and fourth imaging pixels, arranged in two rows and two columns, each imaging pixel having a metal-insulator-metal (MiM) capacitor disposed on at least one metal layer, the first and second imaging pixels being traversed by a signal line extending in a first direction to transmit signals to both of the first and second imaging pixels, including connecting to at least one of an electrical component and a trace of the respective first and second imaging pixels, the third imaging pixel being coupled to a metal interconnect that extends from the signal line in a second direction different than the first direction to receive the signals from the signal line, the third imaging pixel not being traversed by the signal line and being adjacent to the first imaging pixel and disposed in a different column or row than the second imaging pixel.

11. The pixel cell in accordance with claim 10, further comprising a second metal interconnect extending in the second direction and being coupled to the signal line and the fourth imaging pixel to transmit the signals to the fourth imaging pixel, the fourth imaging pixel adjacent to the second imaging pixel, and disposed in a different column or row than the first imaging pixel.

12. The pixel cell in accordance with claim 10, wherein each of the imaging pixels of the pixel cell includes electrical devices organized in a pattern, wherein the pattern of adjacent imaging pixels are organized in mirrored patterns relative to one another.

13. The pixel cell in accordance with claim 10, wherein the length of the metal interconnect is shorter than the length and width of the imaging pixel it is coupled to.

14. The pixel cell in accordance with claim 10, wherein the pixel cell is included in a focal plane array of an image sensor device.

15. The pixel cell in accordance with claim 10, wherein the imaging pixels are arranged in a 2×2 array of a short wave infrared focal plan array.

* * * * *